United States Patent
Cheng

(10) Patent No.: US 8,735,728 B2
(45) Date of Patent: May 27, 2014

(54) PRINTED CIRCUIT BOARD WITH FINS

(75) Inventor: Chien-Pang Cheng, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 344 days.

(21) Appl. No.: 13/049,906

(22) Filed: Mar. 17, 2011

(65) Prior Publication Data

US 2011/0253423 A1     Oct. 20, 2011

(30) Foreign Application Priority Data

Apr. 16, 2010   (CN) .......................... 2010 1 0148568

(51) Int. Cl.
*H05K 1/00*   (2006.01)

(52) U.S. Cl.
USPC ........... 174/252; 174/254; 361/697; 361/719; 361/720; 361/711; 361/708

(58) Field of Classification Search
USPC .......................... 174/252, 254; 361/711, 708
See application file for complete search history.

(56) References Cited

U.S. PATENT DOCUMENTS

| | | | | | |
|---|---|---|---|---|---|
| 5,172,755 | A | * | 12/1992 | Samarov | 165/80.3 |
| 5,796,049 | A | * | 8/1998 | Schneider | 174/252 |
| 5,870,286 | A | * | 2/1999 | Butterbaugh et al. | 361/704 |
| 5,986,893 | A | * | 11/1999 | Leigh et al. | 361/777 |
| 6,335,862 | B1 | * | 1/2002 | Koya | 361/708 |
| 2003/0072135 | A1 | * | 4/2003 | Lonergan et al. | 361/709 |
| 2010/0122838 | A1 | * | 5/2010 | Asami et al. | 174/252 |

FOREIGN PATENT DOCUMENTS

| | | |
|---|---|---|
| CN | 101686626 | 3/2010 |
| JP | 2010-73942 | 4/2010 |
| TW | 200845846 | 11/2008 |

* cited by examiner

*Primary Examiner* — Tuan T Dinh
*Assistant Examiner* — Steven T Sawyer
(74) *Attorney, Agent, or Firm* — Novak Druce Connolly Bove + Quigg LLP

(57) ABSTRACT

A printed circuit board includes an insulating layer, a signal trace, a ground trace, and a fin. The insulating layer has a first surface and an opposite second surface. The signal trace and the ground trace are formed on the first surface of the insulating layer. The first fin is directly formed on the ground trace. Also provided is a method for manufacturing the printed circuit board.

1 Claim, 10 Drawing Sheets

PRINTED CIRCUIT BOARD WITH FINS

BACKGROUND

1. Technical Field

The present disclosure generally relates to printed circuit boards (PCBs), and particularly, relates to a printed circuit board with fins and a method for manufacturing the same.

2. Description of Related Art

Printed circuit boards are widely used in electronic devices, with electronic components mounted thereon, providing electrical transmission thereto. With developments in electronic technology, signal traces of the printed circuit boards need to bear increased current burdens, generating increasing heat when doing so. During operation, the temperature of the printed circuit board increases and resistance of a resistor mounted on the PCB changes, which can seriously curtail life of the electronic elements, such as capacitors mounted on the PCB.

What is needed, therefore, is a printed circuit board with fins and a method for manufacturing the same to overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments are now described in detail with reference to the drawings.

Figure 1:
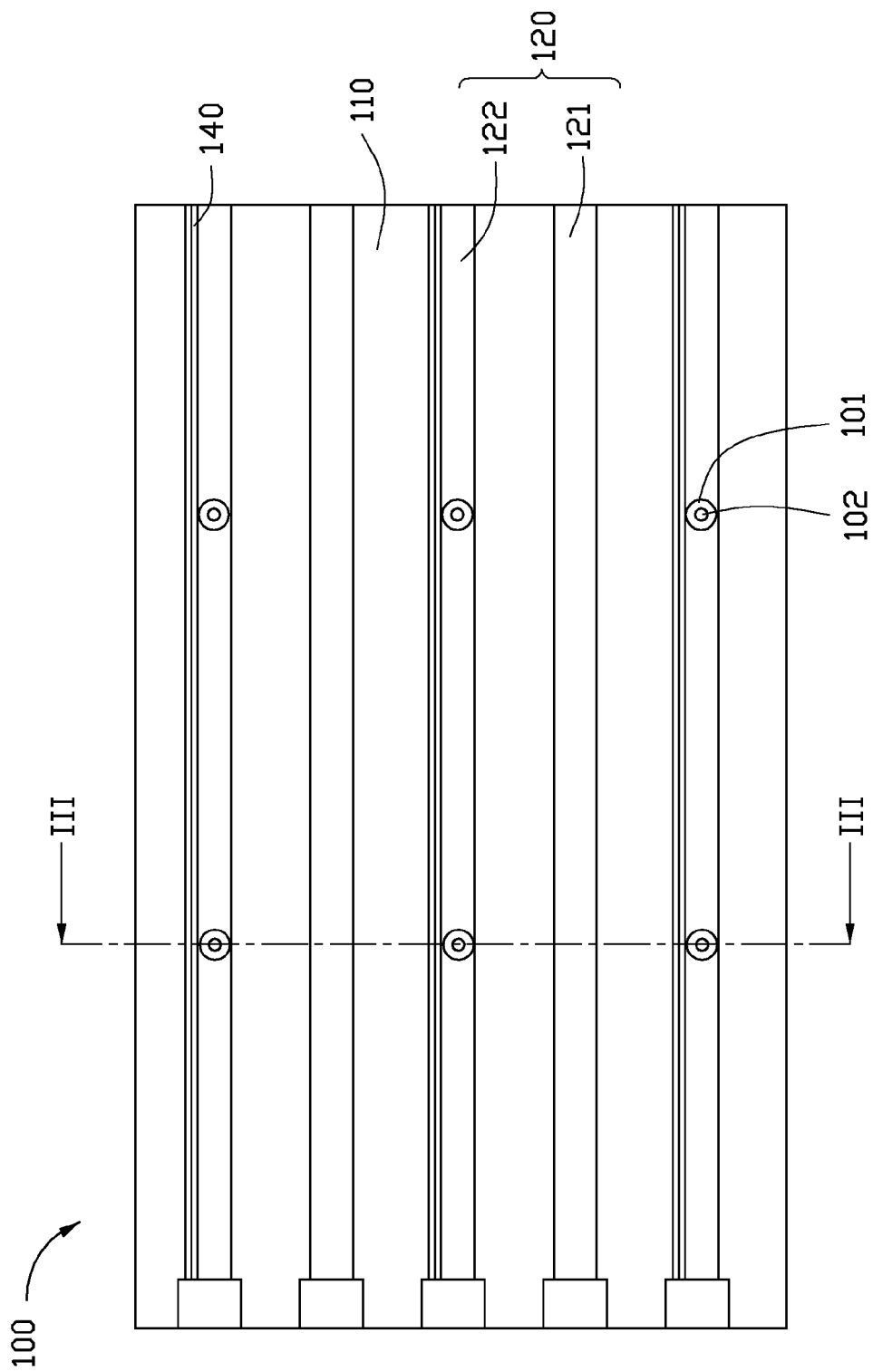
FIG. 1 is a top plan view of a PCB in accordance with an embodiment.
Figure 2:
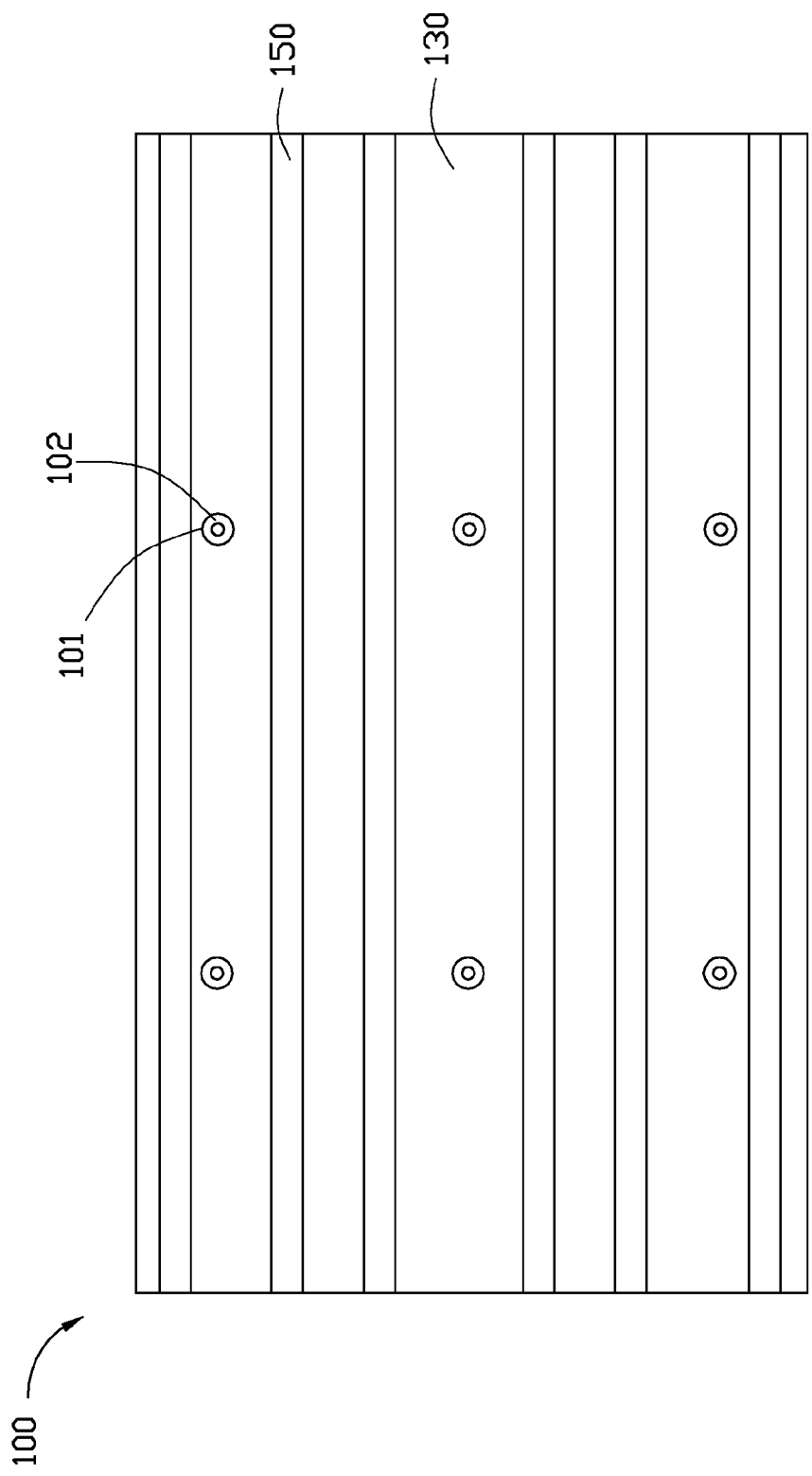
FIG. 2 is a bottom plan view of the PCB of FIG. 1.
Figure 3:
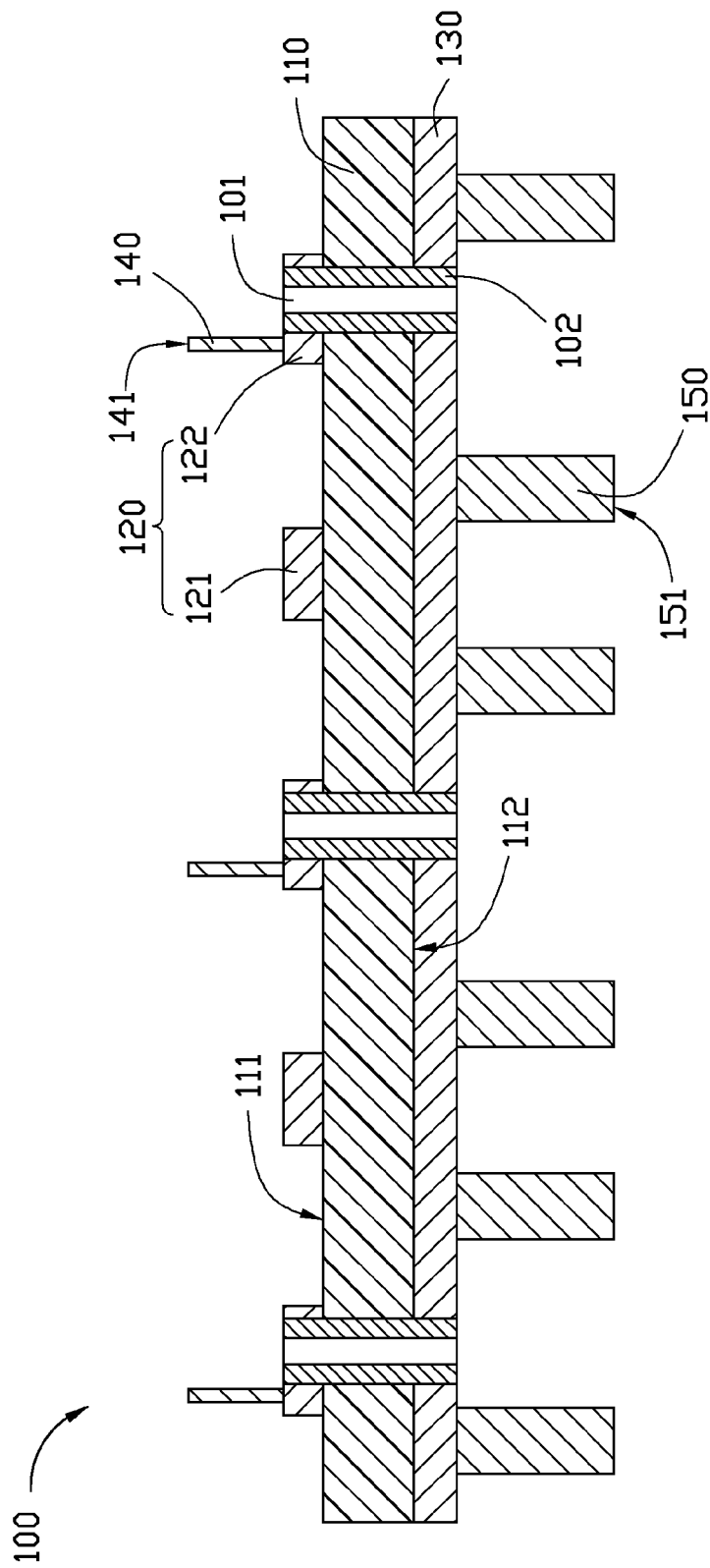
FIG. 3 is a cross section taken along a line III-III of FIG. 2.

FIGS. 1-3 illustrate a PCB 100 in accordance with a first embodiment. The PCB 100 includes an insulating layer 110, an electrically conductive pattern 120, a thermally conductive layer 130, a number of first fins 140, and a number of second fins 150.

The insulating layer 110 has a first surface 111 and a second surface 112 at the opposite side thereof to the first surface 111. The electrically conductive pattern 120 is formed on the first surface 111 of the insulating layer 110. The electrically conductive pattern 120 is made of copper. The electrically conductive pattern 120 includes a number of signal traces 121 and a number of ground traces 122. Each signal trace 121 is spaced from the ground traces 122. In one embodiment, each ground trace 122 is parallel to the signal traces 121. Each ground trace 122 is arranged between two neighbor signal traces 121. In alternative embodiments, the ground traces 122 may surround the signal traces 121.

The thermally conductive layer 130 is formed on the second surface 112 of the insulating layer 110. The thermally conductive layer 130 is made of metal, such as copper or aluminum. In one embodiment, the thermally conductive layer 130 is made of copper and covers the entire second surface 112 of the insulating layer 110.

A number of through holes 101 is defined in the thermally conductive layer 130, the insulating layer 110 and the ground trace 122. The through holes 101 pass through thermally conductive layer 130, the insulating layer 110 and the ground trace 122. A metal plating layer 102 is formed on the inner side of each through hole 101. The metal plating layer 102 communicates the ground trace 122 and the thermally conductive layer 130. The metal plating layer 102 is configured for transmitting the heat of the ground traces 122 to the thermally conductive layer 130.

The first fins 140 are directly formed on the ground traces 122. The first fins 140 are configured for dissipating a heat generated by the signal traces 121. A material of the first fins 140 is same to the material of the ground traces 122. In one embodiment, each first fin 140 is formed on a respective ground trace 122 and is parallel to the corresponding signal trace 122. A thickness of the first fins 140 is in a range from about 30 micrometers to about 50 micrometers. In other words, each first fin 140 has a distal surface 141 away from the ground traces 122. A distance between the distal surface 141 and the surface of the ground traces 122 is in the range from about 30 micrometers to about 50 micrometers.

It can be understood, when the width of the ground trace 122 is too small, the first hest sink 140 formed on the ground trace 122 can be omitted. When the width of the ground trace 122 is large, more first hest sinks can be formed on one ground trace 122.

The second fins 150 are directly formed on the thermally conductive layer 130. A material of the second fins 150 is same to the material of the thermally conductive layer 130. In the illustrative embodiment, the second fins 150 are parallel to and spaced from each other. A thickness of the second fins 150 is in a range from about 30 micrometers to about 50 micrometers. In other words, each second fin 150 has a distal surface 151 away from the thermally conductive layer 130. A distance between the distal surface 151 and the surface of the thermally conductive layer 130 is in a range from about 30 micrometers to about 50 micrometers.

As the PCB 100 includes the first fins 140 and the second fins 150, a heat radiating area is increased, the heat radiating efficiency of the PCB is improved. Furthermore, compared to the addition heat sink attached on the PCB, a dimension of the PCB 100 becomes smaller.

In alternative embodiments, the PCB 100 may be a single side PCB. The PCB 100 does not include the thermally conductive layer 130 and the second fins 150, and no through hole 101 is formed. A heat generated by the signal traces 121 can be dissipated by the ground traces 122 and the first fins 140.

Referring to FIGS. 1, 4-10, a method for manufacturing a PCB provided in a first embodiment includes the following steps.

Figure 4:
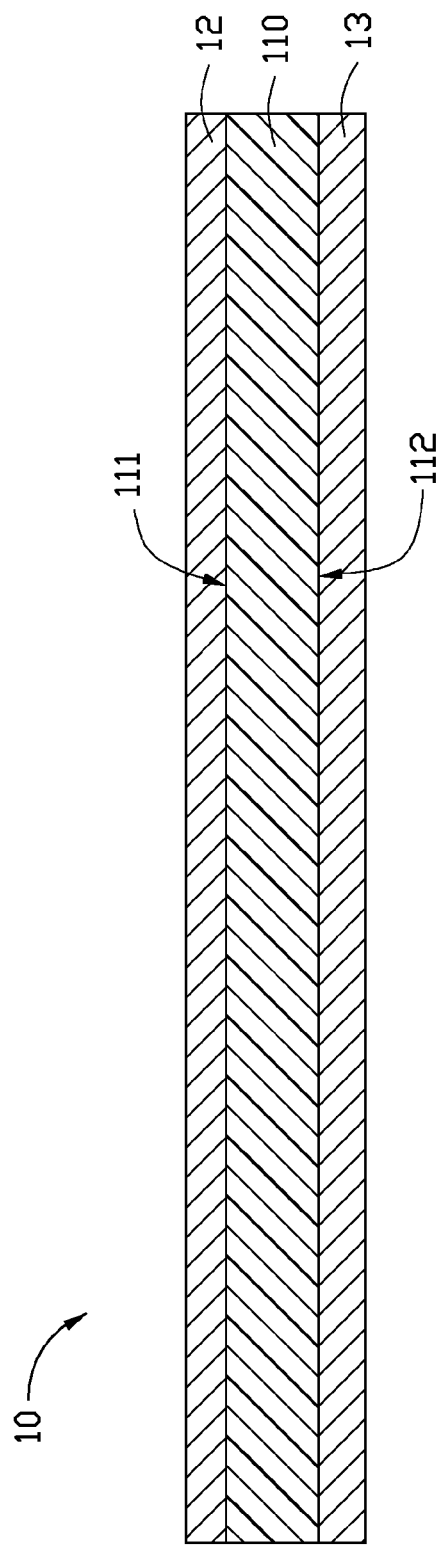
FIG. 4 is a cross section of a copper clad laminate.

In step 1, referring to FIG. 4, a copper clad laminate 10 is provided. The copper clad laminate 10 is double side copper clad laminate. The copper clad laminate 10 includes an insulating layer 110, a first copper layer 12 and a second copper layer 13. The insulating layer 110 has a first surface 111 and a second surface 112 at the opposite side thereof to the first surface 111. The first copper layer 12 is formed on the first surface 111. The second copper layer 13 is formed on the second surface 112.

Figure 5:
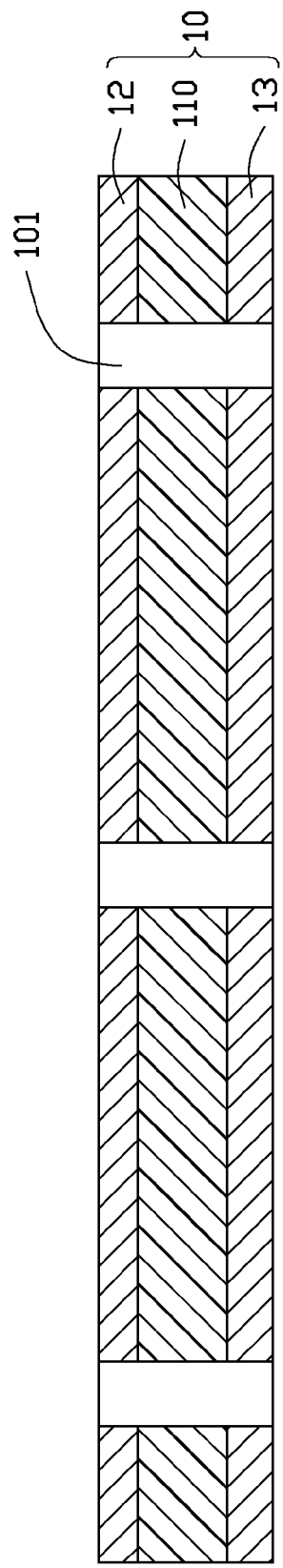
FIG. 5 is similar to FIG. 4, but shows a plurality of through holes defined in the copper clad laminate.
Figure 6:
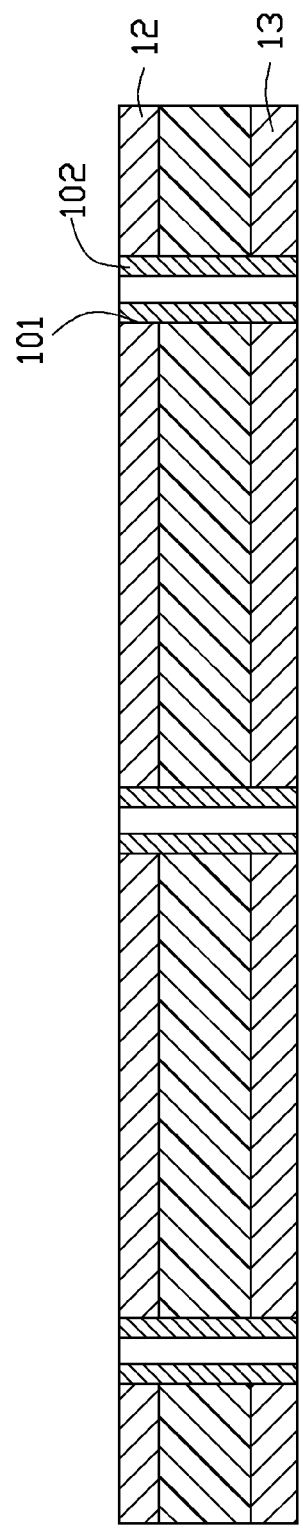
FIG. 6 is similar to FIG. 5, but shows a metal plating layer formed in each through hole.

In step 2, referring to FIG. 5 and FIG. 6, a number of through holes 101 are defined in the copper clad laminate 10, and a metal plating layer 102 is formed on the inner side of the through holes 101.

The through holes 101 may be formed using a punching process. The through holes 101 pass through the first copper layer 12, the insulating layer 110 and the second copper layer 13. The metal plating layer 102 can be formed using an electroless plating process.

Figure 7:
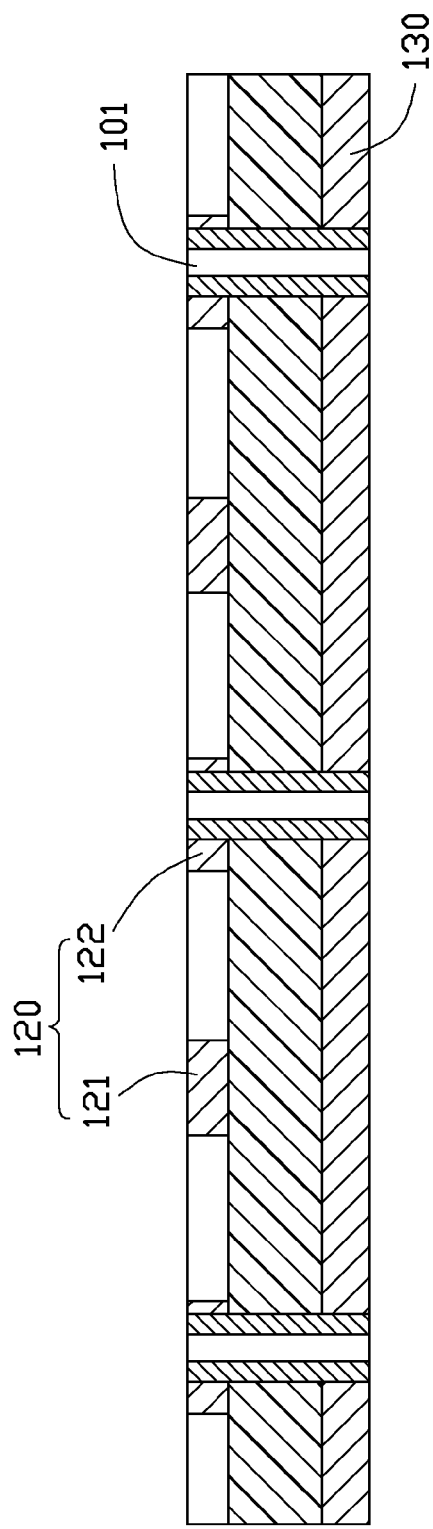
FIG. 7 is similar to FIG. 6, but shows an electrically conductive pattern formed in the first copper layer.

In step 3, referring to FIG. 7, the electrically conductive pattern 120 is formed in the first copper layer 12 using a photolithography process and an etching process The electrically conductive pattern 120 includes a number of signal traces 121 and a number of ground traces 122. The through holes 101 are corresponding to the ground traces 122. The through holes 101 are formed in the ground traces 122. In illustrative embodiment, the second copper layer 13 is used as the thermally conductive layer 130, such that the metal plating layer 102 in the through holes 101 electrically and thermally connects the ground traces 122 and the thermally conductive layer 130.

In step 4, referring to FIGS. 1 and 8-10, the first fins 140 are directly formed on the ground traces 121, and the second fins 150 are directly formed on the thermally conductive layer 130.

Figure 8:
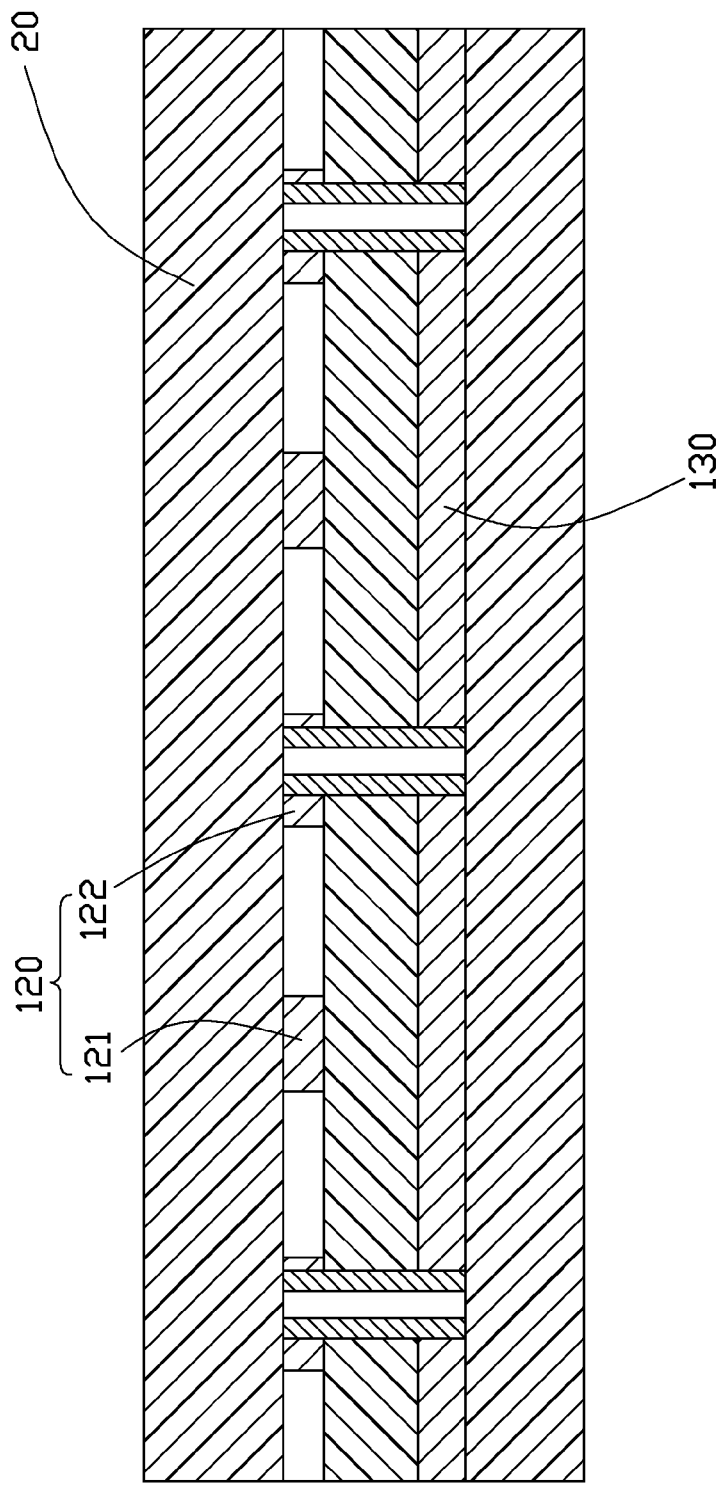
FIG. 8 is similar to FIG. 7, but shows a first photoresist layer and a second photoresist layer formed on two opposite side surface of the copper clad laminate.
Figure 9:
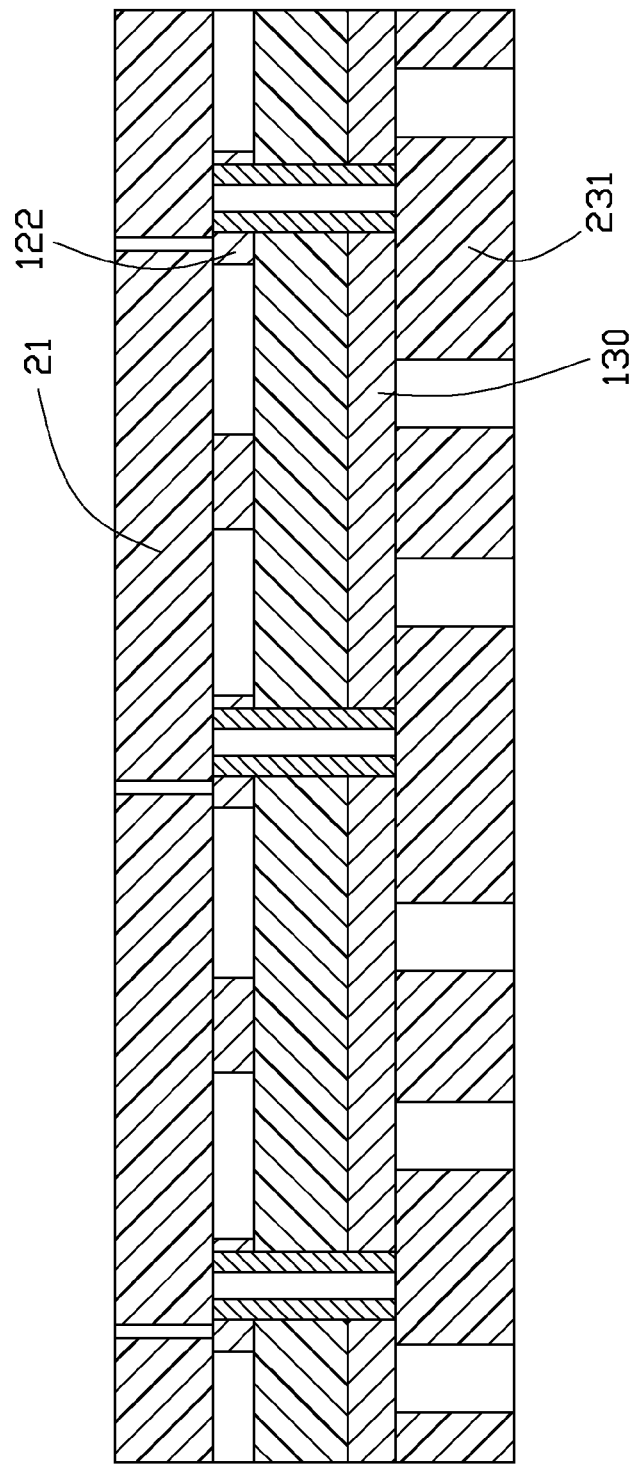
FIG. 9 is similar to FIG. 8, but shows a first patterned photoresist layer formed in the first photoresist layer and a second patterned photoresist layer formed in the second photoresist layer.

Firstly, referring to FIG. 8 and FIG. 9, a first photoresist layer 20 is applied onto and over the entire surface of the signal traces 121, the surface of ground traces 122 and the first surface 112 uncovered by the signal traces 121 and the ground traces 122, and a first patterned photoresist layer 21 is formed by exposure and development in the first photoresist layer 20. A shape of the first patterned photoresist layer 21 conforms to that of the first fins 140. The first patterned photoresist layer 21 exposes those portions of the surface of the ground traces 122 that will eventually become the first fins 140. In one embodiment, the first photoresist layer 20 is a dry photoresist film attached on surface of the signal traces 121, the surface of ground traces 122 and the first surface 112 using a laminating process. In alternative embodiments, the first photoresist layer 20 can be a liquid photoresist layer applied using a coating process. Then as the first photoresist layer 20 is exposed and developed, portion of the first photoresist layer 20 remains to form the first patterned photoresist layer 21, portions of the surface of the ground traces 122 corresponding to the first fins 140 are exposed from all of the gaps in the first patterned photoresist layer 21.

Similarly, a second photoresist layer 30 is applied onto and over the entire surface of the thermally conductive layer 130, and a second patterned photoresist layer 31 is formed by exposure and development in the second photoresist layer 30. A shape of the second patterned photoresist layer 31 conforms to that of the second fins 150. The second patterned photoresist layer 31 exposes those portions of the surface of the thermally conductive layer 130 that will eventually become the second fins 150.

In one embodiment, the thickness of the first photoresist layer 20 is substantially equal to the thickness of the first fins 140, and the thickness of the second photoresist layer 30 is substantially equal to the thickness of the second fins 150 to be formed.

Figure 10:
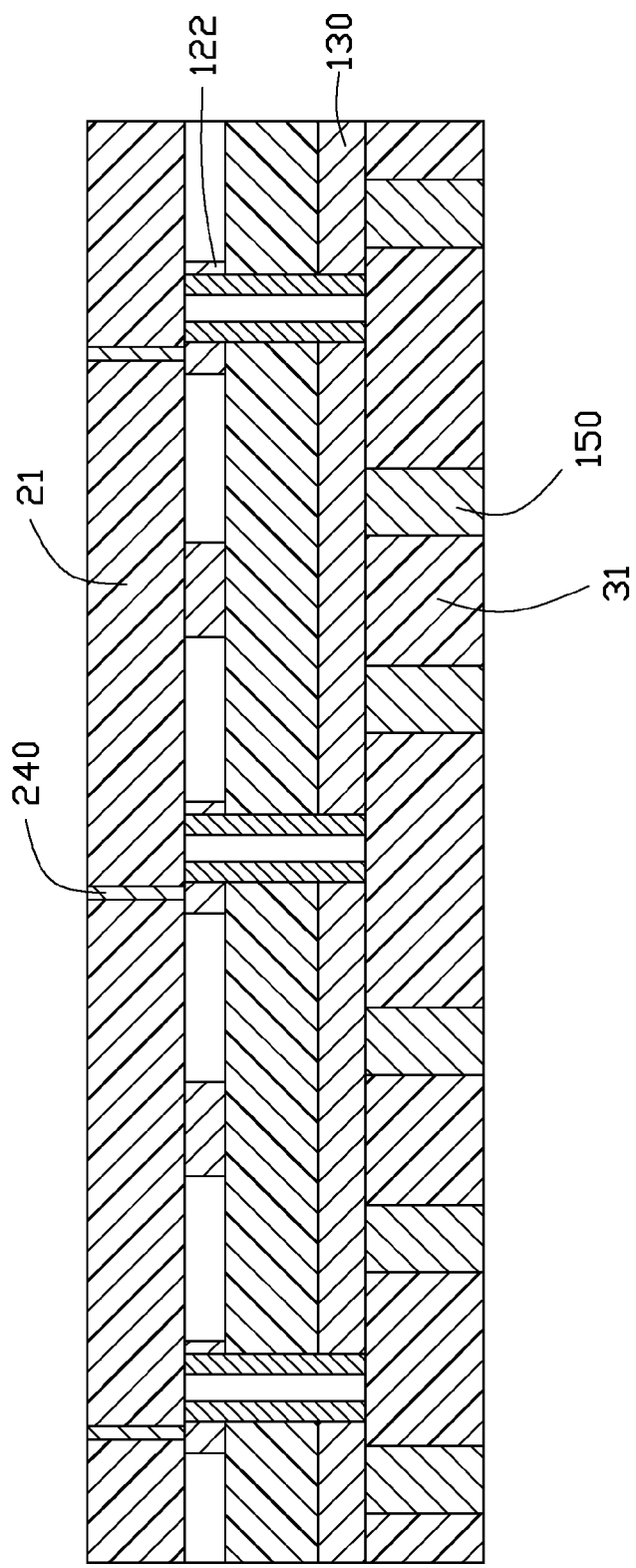
FIG. 10 is similar to FIG. 9, but shows at least one first fin formed on the first ground trace and at least one second fin formed on the thermally conductive layer.

Secondly, referring to FIG. 10, a number of first fins 140 are formed on the exposed portions of the surface of the ground traces 122 by electroplating, and a number of second fins 150 are formed on the exposed portions of the surface of the thermally conductive layer 130. In operation, before plating, the exposed portions of the surface of the ground traces 122 and the surface of the thermally conductive layer 130 are cleaned and micro-etched to improve adhesion during plating.

Referring to FIG. 1 and FIG. 10, the first patterned photoresist layer 21 and the second patterned photoresist layer 31 are removed by stripping, and the PCB 100 with fins is obtained.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:
1. A printed circuit board, comprising:
an insulating layer having a first surface and an opposite second surface;
a plurality of signal traces and a plurality of ground traces formed on the first surface, the signal traces configured for transmitting signals, the ground traces configured for dissipating heat generated by the signal traces, each ground trace arranged between two neighboring signal traces;
a plurality of first fins, each first fin directly formed on a corresponding one of the ground traces;
a thermally conductive layer formed on the second surface of the insulating layer; and
a plurality of plated through holes thermally and electrically connected between the thermally conductive layer and the ground traces.

* * * * *